United States Patent

Münch et al.

[11] Patent Number: 6,118,071
[45] Date of Patent: Sep. 12, 2000

[54] DEVICE FOR ELECTRICALLY CONNECTING THE FRAME OR CABINET HOUSING OF A SWITCHING CABINET WITH THE DOOR

[75] Inventors: Udo Münch, Sinn; Wolfgang Reuter, Burbach; Matthias Müller, Haiger, all of Germany

[73] Assignee: Rittal-Werk Rudolf GmbH & Co. KG, Herborn, Germany

[21] Appl. No.: 09/101,389
[22] PCT Filed: Dec. 20, 1996
[86] PCT No.: PCT/EP96/05787
   § 371 Date: Jul. 15, 1998
   § 102(e) Date: Jul. 15, 1998
[87] PCT Pub. No.: WO97/26689
   PCT Pub. Date: Jul. 24, 1997

[30] Foreign Application Priority Data

Jan. 18, 1996 [DE] Germany ............ 196 01 614
Jul. 6, 1996 [DE] Germany ............ 296 11 787 U

[51] Int. Cl.⁷ .................................................. H05K 5/02
[52] U.S. Cl. ................... 174/51; 174/6; 174/135; 361/818; 439/92; 439/100; 439/108; 439/609; 312/249.7
[58] Field of Search ............... 174/50, 35 GC, 174/35 MS, 135, 35 R, 51, 6; 361/800, 816, 818, 799; 439/607, 609, 92, 100, 108; 312/109, 199, 270.2, 249.3, 249.7, 223.1

[56] References Cited

U.S. PATENT DOCUMENTS

| 2,684,994 | 7/1954 | Kwake ............ 174/51 |
| 3,257,496 | 6/1966 | Hamilton ............ 174/38 |
| 4,316,050 | 2/1982 | Bergmark ............ 174/7 |
| 4,760,496 | 7/1988 | Koch . |
| 4,803,306 | 2/1989 | Malmquist . |
| 4,960,964 | 10/1990 | Schnell et al. ............ 174/51 |
| 5,233,507 | 8/1993 | Günther et al. . |
| 5,608,611 | 3/1997 | Szudarek et al. ............ 361/753 |

FOREIGN PATENT DOCUMENTS

| 36 11 693 | 5/1987 | Germany . |
| 41 10 800 | 7/1992 | Germany . |
| 195 40 300 | 8/1996 | Germany . |
| 2 183 920 | 6/1987 | United Kingdom . |

*Primary Examiner*—Dean A. Reichard
*Assistant Examiner*—Dhiru R Patel
*Attorney, Agent, or Firm*—Pauley Petersen Kinne & Fejer

[57] ABSTRACT

A device for electrically connecting the frame of a switching cabinet in which the cabinet housing is connected to the door by contact elements which are thereby electrically connected to the frame sections of the frame-like borders of the cabinet housing facing the door and are supported resiliently as well as electrically against the closed door. Specially designed contact springs can be used to create contacts between a subsequently fitted standard switching cabinet provided with a surface protection layer and the frame or cabinet housing in the door closure area.

19 Claims, 2 Drawing Sheets

DEVICE FOR ELECTRICALLY CONNECTING THE FRAME OR CABINET HOUSING OF A SWITCHING CABINET WITH THE DOOR

BACKGROUND OF THE INVENTION

1. Field of the Invention

This invention relates to a device for an electrically conducting connection of a rack or a cabinet body of a switchgear cabinet with a door using contact elements, which are connected in an electrically conducting manner with frame legs of the rack or frame-like bevels of the cabinet body facing the door, and which are supported resiliently and in an electrically conducting manner on the closed door, wherein the contact elements are formed as multiply beveled contact springs. The door has an electrically conducting surface at a distance from the frame legs of the rack or the frame-like bevels of the cabinet body and the securing sections of the contact springs make a transition outside of the openings on the side facing the door into multiply angled contact and support sections, which are introduced between the electrically conducting surface and the frame leg or the frame-like bevel and are resiliently supported on the electrically conducting surface and the frame leg or the frame-like bevel.

2. Description of Prior Art

A device of this type is shown to be known from Great Britain Reference GB-A-2 183 920. In this known device resilient contact elements make contact between a door of a cabinet body, or respectively a rack, which have been slipped on the free end of a profiled leg of the door, or respectively the cabinet body. A section of the contact springs which have multiple bevels, is spaced apart from the flat side of the respective leg, so that a resilient support of the contact element on the door results.

A resilient contact element is also provided in connection with a further device discussed in U.S. Pat. No. 4,803,306 for the electrically conducting connection of a lateral wall with a housing body. The contact element has two securing sections with securing claws, which are inserted into an opening of the housing body.

With other known devices of this type, a contact strip with a plurality of contact studs is placed on a strip of the frame leg of the cabinet body. In this case it is necessary that the strip has an electrically conducting surface at least in the area of the placement surface. The same applies to the door in the area in which the contact studs are resiliently supported on the door. But this means that the switchgear cabinets with the door must be appropriately prepared for these contacts. It is therefore necessary to take special steps when applying the protective surface coating, so that these areas of the rack or the cabinet body and door remain free, or respectively have a coating which conducts electricity, in particular, well. This procedure makes the manufacture of the switchgear cabinet considerably more expensive. Furthermore, it is not possible to provide a commercially available switchgear cabinet, which already has a protective surface coating, with contacts at a later time.

SUMMARY OF THE INVENTION

It is therefore one object of this invention to create a device of the type mentioned at the outset, by means of which it is possible to provide contacts in the area of the closing side of the door retroactively also for a switchgear cabinet having a protective surface coating.

This object is attained in accordance with this invention in that the contact springs are inserted with securing sections into an opening of the frame leg or the frame-like bevels of the cabinet body, or are screwed or riveted thereon in an electrically conducting manner, and are maintained in the opening by securing claws extending from the securing sections while making an electrical connection with the frame leg or the cabinet body. Two contact sections form a contact edge, with which the contact spring rests against the door frame. The support section of the contact spring is aligned parallel with the abutment side of the frame-like bevel and has a distance from the contact edge which is slightly greater than the distance between the door frame and the frame leg or the frame-like bevel.

In the course of inserting the contact spring into the opening of the frame leg or the frame-like bevel, the securing frames wander through the protective surface coating in the area of the opening, and make an electrically conducting connection between the rack or the cabinet body and the contact spring in the simplest way. The securing claws furthermore fix the contact spring captively on the frame leg or the frame-like bevel. The door has an electrically conducting surface. This can be a door frame, screwed to the inside of the door and in electrically conducting connection with it, for example.

Because of their resilient support on both parts, the contact and support sections of the contact spring, which are introduced between the door frame and the frame legs or frame-like bevels, provide sufficient contact pressure against the door frame when the door is closed.

So that the contact spring can be introduced firmly supported into the opening of the frame leg or the frame-like bevel, the securing sections are matched in their width to the dimensions of the preferably rectangular openings in the frame legs of the rack or the frame-like bevels of the cabinet body. The securing claws are designed approximately triangular and partially extend behind the opening in the frame leg or the frame-like bevels.

If the securing claws project past the narrow sides and the outsides of the securing sections facing away from each other, the protective surface coating of the frame leg or the frame-like bevel is positively penetrated when introducing the contact spring into the opening, and the securing claws rest in an electrically conducting manner under spring tension against the frame leg or the frame-like bevel.

The support of the contact spring in the opening of the frame leg or the frame-like bevel can be further improved because the securing section of the contact spring which faces away from the door makes a transition outside of the opening in the frame leg or the frame-like bevel of the cabinet body into an abutment section resting against the frame leg, and the abutment, contact and support sections of the contact spring are wider than the securing sections.

If in accordance with a further embodiment contact claws are formed at the transition areas from the securing section to the abutment section and the contact sections, which are supported on the frame leg or on the frame-like bevel and make electrically conducting connections, the number of contact points between the contact spring and the frame legs or the frame-like bevels is increased in a simple manner.

So that the contact spring does not hinder the closing process of the door, another embodiment provides that two contact sections preferably form an obtuse angle and constitute a contact edge, with which the contact spring rests against the door frame. In the course of the closing process, the door frame slides along the one contact section until the contact edge is supported on the side of the door frame which is parallel with the frame leg or the frame-like bevel, in the course of which the prestress is generated in the contact and support sections. So that this prestress is actually created, the support section of the contact spring is aligned parallel with the abutment side of the frame leg or the frame-like bevel and has a distance from the contact edge which is slightly greater than the distance between the door frame and the frame leg or the frame-like bevel.

So that the support section can slide without hindrance along the frame leg or the frame-like bevel, the support section is bent behind the contact sections, viewed from the direction of the securing sections, and terminates in an end section, which is bent inward in the direction toward the contact sections.

Alternatively, the support section is arranged between the securing section facing the door and the one contact section.

BRIEF DESCRIPTION OF DRAWINGS

This invention will be explained in more detail by means of an exemplary embodiment represented in the drawings wherein.

DESCRIPTION OF PREFERRED EMBODIMENTS

Figure 1:
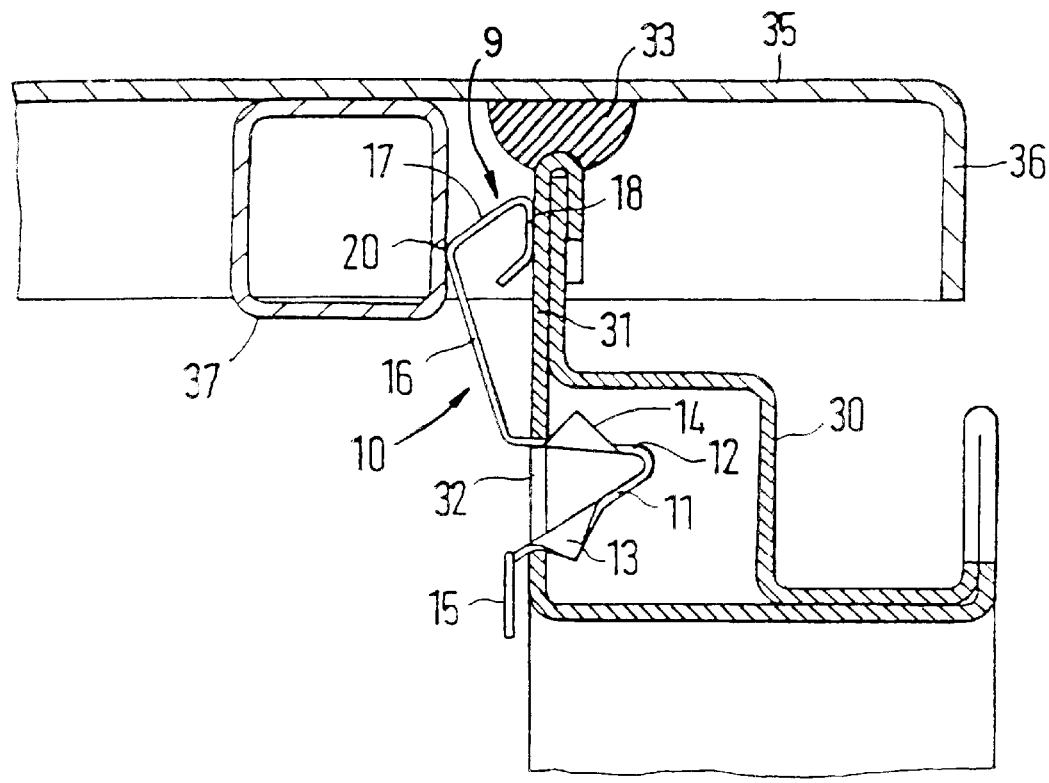
FIG. 1 is a partial cross sectional view of an electrically conducting connection between a closed door and the rack of a switchgear cabinet made by a contact spring in accordance with one preferred embodiment of this invention.

As the partial section in FIG. 1 shows, a door frame 37 is attached to an inside of a door 35 at a distance from a beveled edge 36, which is put together from profiled sections, in the exemplary embodiment square hollow profiled sections. The door frame 37 is screwed to the door 35, and the screws are welded onto the inside of the door 35. The door frame 37 therefore is in electrically conducting connection with the door 35. Therefore the door frame 37 can easily be replaced if it does not have an electrically conducting surface, as is now required.

With the door 35 closed, the door frame 37 is at a distance from frame legs 30 of the rack on all four sides. In this case the frame legs 30 can also be constituted by bevels of the associated lateral walls of a cabinet body.

The frame legs 30 have a profile side which extends vertically with respect to the door 35 and terminates in a sealing strip 31, which is supported on a sealing element 33, which can be formed on the inside of the door 35. A series of preferably rectangular openings are cut in the profile side of the frame leg 30, so that contact can be made with contact springs 10 at several points of all four sides.

Figure 2:
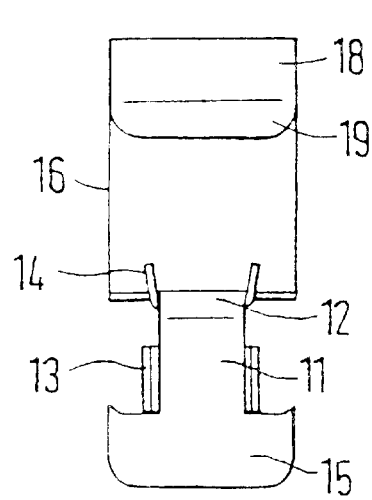
FIGS. 2 and 3 show a front view and a side view of a contact spring offset by 90° between both views.
Figure 3:
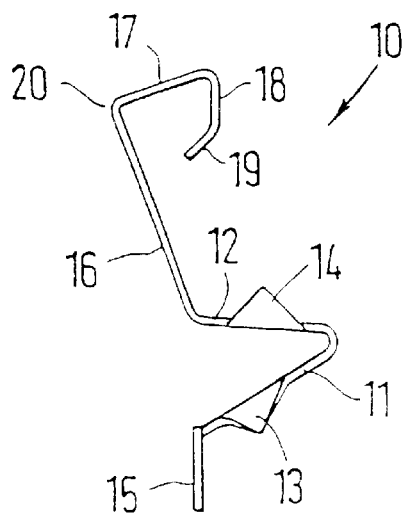

A contact spring 10, such as shown in FIGS. 2 and 3, is used for making contact. The contact spring 10 is a simple stamped and bent part made from a spring steel strip. Two securing sections 11 and 12, which are placed at an acute angle in relation to each other, have securing claws 13 and 14 on their narrow sides, which protrude from the narrow sides and the outsides of the securing sections 11 and 12. If the width of the securing sections 11 and 12 is matched to the dimensions of the opening 32 in the frame leg 30, a kind of engagement fastening is achieved by means of the securing claws 13 and 14, when the securing sections 11 and 12 are introduced into an opening 32, so that the contact spring 10 is fixed captively on the frame leg 30. In the process the securing claws 13 and 14 penetrate through the protective surface coating of the frame leg 30 and rest under prestress in an electrically conducting manner on the frame leg 30 in the area of the opening 32.

The securing section 11 facing away from the door 35 terminates in an abutment section 15, which is wider than the securing section 11 and can improve the support of the contact spring 10 by resting against the frame leg 30. It is furthermore possible to form securing claws on the transition to the abutment section 15, which are supported resiliently and with electric contact on the frame leg 30.

The securing section 12 facing the door 35 terminates outside of the opening 32 in contact sections 16 and 17, a support section 18 and an end section 19. The contact sections 16 and 17, the support section 18 and the end section 19 are introduced between the door frame 37 and the frame leg 30. In the process the contact sections 16 and 17 form a contact edge 20 facing the door frame 37. The contact section 17 makes a transition into a support section 18, which extends parallel with the strip 31 of the frame leg 30, and which in turn terminates in the end section 19, which is bent in a direction toward the contact sections 16 and 17.

With the door 35 opened, the distance between the contact edge 20 and the support section 18 is greater than the distance between the door frame 37 and the frame leg 30 with the door 35 closed. In the course of closing the door 35, the door frame 37 slides upward on the contact section 17 and when passing the contact edge 20, it compresses the contact spring 10, so that sufficient contact pressure is created. However, the support section 18 can perform a sliding movement on the strip 31 of the frame leg 30 without hindrance.

The contact sections 16 and 17, the support section 18 and the end section 19 are also wider than the securing section 12, and securing claws can be formed at the transition from the securing section 12 to the contact section 16, which are resiliently supported on the frame leg 30 in the area of the opening 32, penetrate through the protective surface coating and form further contact points. With the door 35 open, the contact spring 10 remains supported on the frame leg 30, and the contact sections 16 and 17 again take up their relaxed initial position.

Figure 4:
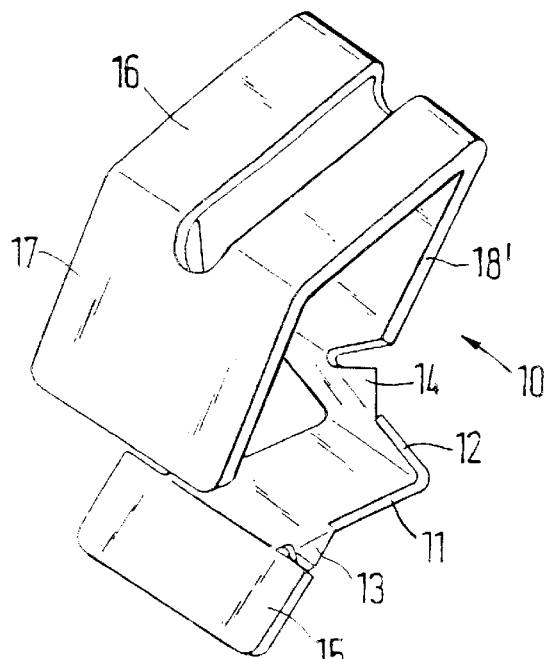
FIGS. 4 to 6 show a perspective and two side views, respectively, of an installation process and the installed state of a further embodiment of the contact spring.
Figure 5:
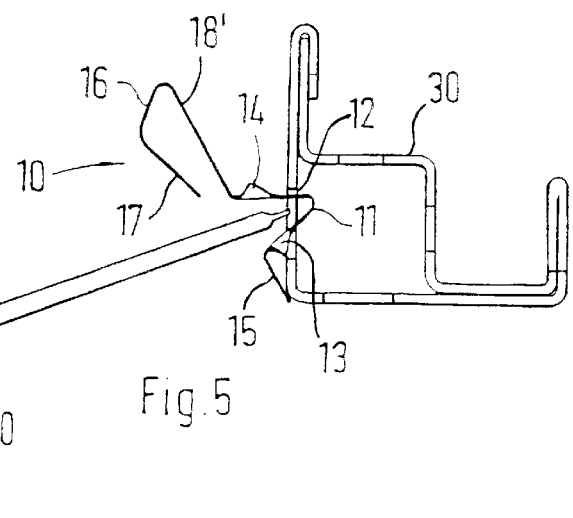
Figure 6:
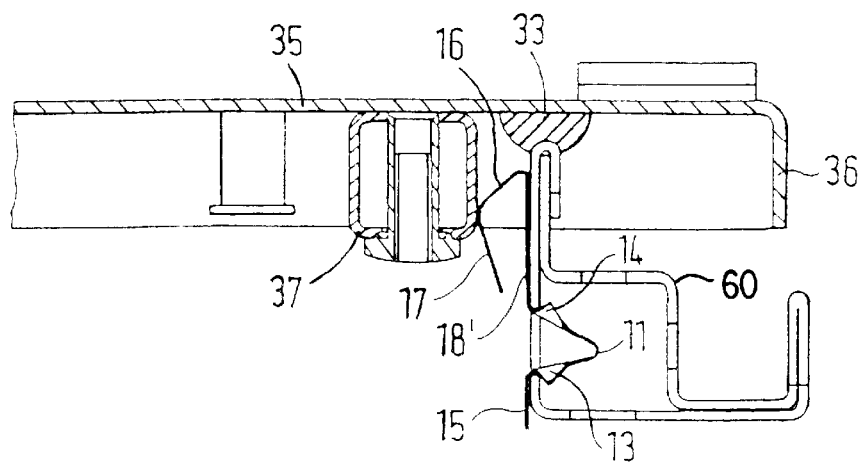

A further embodiment of the contact spring 10 is shown in FIGS. 4 to 6, wherein FIG. 4 is a perspective view, FIG.

5 shows the procedure of inserting the contact spring with a simple tool 40, and FIG. 6 shows an installed state. In this embodiment the support section 18' is arranged between the securing section 12 facing the door 35 and the one contact section 16, and the contact section 16 is essentially bent away in a V-shape from the support section 18', so that it faces away from the door 35.

If no openings 32 are provided, the contact springs 10, 10' can be screwed or riveted in an electrically conducting manner to the frame leg 30.

A frame-like bevel of a cabinet body can also take the place of the frame leg 30, which also has openings and permits electrically conducting connections with the door by means of similar contact springs.

What is claimed is:

1. In a device for an electrically conducting connection of a rack or a cabinet body of a switchgear cabinet with a door (35) by contact elements (9) connected in an electrically conducting manner with one of frame legs (30) of the rack and frame-like bevels of the cabinet body facing the door (35), and which are supported resiliently and in said electrically conducting manner on a closed door, wherein the contact elements (9) are formed as multiple beveled contact springs (10), wherein the door has an electrically conducting surface (37) at a distance from one of the frame legs (30) and the frame-like bevels, and wherein securing sections (12) of the contact springs (10) make a transition outside of openings (32) on a side facing the door (35) into multiple angled contact sections (16, 17) and support sections (18), which are introduced between the electrically conducting surface (37) and one of the frame legs (30) and the frame-like bevels and are resiliently supported on the electrically conducting surface (37) and one of the frame legs (30) and the frame-like bevels, the improvement comprising:

the contact springs (10) inserted with the securing sections (12) and securing sections (11) into one of the openings (32) of one of the frame legs (30) and the frame-like bevels in said electrically conducting manner, and are maintained in the openings (32) by a plurality of securing claws (13, 14) extending from the securing sections (11, 12) and making said electrical connection with one of the frame legs (30) and the frame-like bevels;

the contact sections (16, 17) forming a contact edge (20) which rests against the door (35), and the support sections (18) of the contact springs (10) aligned parallel with one of an abutment side of the frame legs (30) and an abutment side of the frame-like bevels and have a first distance from the contact edge (20) which is greater than a second distance between the door (35) and one of the frame legs (30) and the frame-like bevels.

2. In the device in accordance with claim 1, wherein the electrically conducting surface which is placed on the inside of the door (35).

3. In the device in accordance with claim 1, wherein a width of the securing sections (11, 12) is matched to dimensions of the openings (32) of one of the frame legs and the frame-like bevels, wherein the openings are rectangular.

4. In the device in accordance with claim 3, wherein the securing claws (13, 14) are designed approximately triangular and partially extend behind the rectangular openings (32) of one of the frame legs (30) and the frame-like bevels.

5. In the device in accordance with claim 4, wherein the securing claws (13, 14) project past narrow sides and outsides of the securing sections (11, 12) facing away from each other.

6. In the device in accordance with claim 5, wherein the securing sections (11) of the contact springs (10) which faces away from the door (35) makes a transition outside of the openings (32) in one of the frame legs (30) and the frame-like bevels into an abutment section (15) resting against the frame legs (30).

7. In the device in accordance with claim 6, wherein the abutment section (15), the contact sections (16, 17), the support sections (18), and end sections (19) of the contact springs (10) are wider than the securing sections (11, 12).

8. In the device in accordance with claim 7, wherein the securing claws are formed at transition areas from the securing sections (11, 12) to the abutment section (15) and the contact sections (16, 17), which are supported on one of the frame legs (30) and the frame-like bevels and make said electrically conducting connections.

9. In the device in accordance with claim 8, wherein the contact sections (16, 17) form an obtuse angle and the contact edge (20) rests against the door (35).

10. In the device in accordance with claim 9, wherein the support sections (18) are bent behind the contact sections (16, 17) viewed from a direction of the securing sections (11, 12), as a section facing away from the door (35) and terminates in said end sections (19), which is bent inward in a direction toward the contact sections (16, 17).

11. In the device in accordance with claim 9, wherein the support section (18') is arranged between the securing section (12) facing the door (35) and one of the contact sections (16, 17).

12. In the device in accordance with claim 1, wherein the securing claws (13, 14) are designed approximately triangular and partially extend behind the openings (32) of one of the frame legs (30) and the frame-like bevels.

13. In the device in accordance with claim 1, wherein the securing claws (13, 14) project past narrow sides and outsides of the securing sections (11, 12) facing away from each other.

14. In the device in accordance with claim 1, wherein the securing sections (11) of the contact springs (10) which faces away from the door (35) makes a transition outside of the openings (32) in one of the frame legs (30) and the frame-like bevels into an abutment section (15) resting against the frame legs (30).

15. In the device in accordance with claim 1, wherein an abutment section (15), the contact sections (16, 17), the support sections (18), and end sections (19) of the contact springs (10) are wider than the securing sections (11, 12).

16. In the device in accordance with claim 1, wherein the securing claws are formed at transition areas from the securing sections (11, 12) to an abutment section (15) and the contact sections (16, 17), which are supported on one of the frame legs (30) and the frame-like bevels and make electrically conducting connections.

17. In the device in accordance with wherein 1, wherein the contact sections (16, 17) form an obtuse angle and the contact edge (20) rests against the door (35).

18. In the device in accordance with claim 1, wherein the support sections (18) are bent behind the contact sections (16, 17) viewed from a direction of the securing sections (11, 12), as a section facing away from the door (35) and terminates in an end section (19), which is bent inward in the direction toward the contact sections (16, 17).

19. In the device in accordance with claim 1, wherein the support section (18') is arranged between the securing sections (12) facing the door (35) and one of the contact sections (16, 17).

* * * * *